United States Patent
Park

(10) Patent No.: US 8,703,589 B2
(45) Date of Patent: Apr. 22, 2014

(54) FLAT PANEL DISPLAY AND METHOD OF MANUFACTURING THE SAME

(75) Inventor: Cheol-Ho Park, Yongin (KR)

(73) Assignee: Samsung Display Co., Ltd., Gyeonggi-do (KR)

( * ) Notice: Subject to any disclaimer, the term of this patent is extended or adjusted under 35 U.S.C. 154(b) by 0 days.

(21) Appl. No.: 13/454,965

(22) Filed: Apr. 24, 2012

(65) Prior Publication Data

US 2012/0326158 A1 Dec. 27, 2012

(30) Foreign Application Priority Data

Jun. 27, 2011 (KR) ........................ 10-2011-0062487

(51) Int. Cl.
*H01L 21/20* (2006.01)
*H01L 21/36* (2006.01)
*H01L 21/84* (2006.01)

(52) U.S. Cl.
USPC ........... 438/486; 438/487; 438/151; 438/166; 438/149

(58) Field of Classification Search
USPC .......................... 438/486, 487, 151, 149, 166
See application file for complete search history.

(56) References Cited

U.S. PATENT DOCUMENTS

| | | | | |
|---|---|---|---|---|
| 5,879,976 A | * | 3/1999 | Fujiwara | 438/163 |
| 6,200,837 B1 | * | 3/2001 | Ihn et al. | 438/166 |
| 6,479,331 B1 | * | 11/2002 | Takemura | 438/153 |
| 6,569,716 B1 | * | 5/2003 | Suzuki | 438/149 |
| 6,864,130 B2 | | 3/2005 | Koo et al. | |
| 7,259,103 B2 | * | 8/2007 | Kim | 438/705 |
| 2004/0266078 A1 | * | 12/2004 | Kim | 438/166 |
| 2005/0130357 A1 | * | 6/2005 | Song et al. | 438/197 |
| 2005/0233575 A1 | * | 10/2005 | Abe | 438/622 |
| 2005/0263761 A1 | * | 12/2005 | Kim et al. | 257/57 |
| 2006/0043072 A1 | * | 3/2006 | Chen et al. | 216/88 |
| 2008/0176348 A1 | * | 7/2008 | Jeoung et al. | 438/30 |

FOREIGN PATENT DOCUMENTS

| | | |
|---|---|---|
| JP | 08-255916 A | 10/1996 |
| JP | 2004-72092 A | 3/2004 |
| KR | 10-2004-0104982 A | 12/2004 |
| KR | 10-2005-0052730 A | 6/2005 |

* cited by examiner

*Primary Examiner* — Ha Tran T Nguyen
*Assistant Examiner* — Thai T Vuong
(74) *Attorney, Agent, or Firm* — Knobbe, Martens Olson & Bear, LLP

(57) ABSTRACT

A flat panel display having a thin-film transistor (TFT) and a pixel unit and a method of manufacturing the same are disclosed. In one embodiment, the method includes forming a step difference layer having a relatively high step and a relatively low step on a substrate and forming an amorphous silicon layer on the step difference layer along a height shape of the step difference layer. The method further includes crystallizing the amorphous silicon layer into a crystalline silicon layer and polishing the crystalline silicon layer to form a planarized surface of the crystalline silicon layer having no height differences so that the crystalline silicon layer remains on a region corresponding to the low step and an active layer is formed. According to this method, crystallization protrusions are effectively removed from the active layer, and thus, stable brightness characteristics of the display apparatus are guaranteed.

8 Claims, 5 Drawing Sheets

FLAT PANEL DISPLAY AND METHOD OF MANUFACTURING THE SAME

CROSS-REFERENCE TO RELATED PATENT APPLICATION

This application claims the benefit of Korean Patent Application No. 10-2011-0062487, filed on Jun. 27, 2011, in the Korean Intellectual Property Office, the disclosure of which is incorporated herein in its entirety by reference.

BACKGROUND

1. Field

The described technology generally relates to a flat panel display having an improved structure of a thin-film transistor and a method of manufacturing the flat panel display.

2. Description of the Related Technology

Generally, flat panel displays such as organic light-emitting displays and liquid crystal displays include thin-film transistors (TFTs) and pixel units that are driven by the TFTs to display an image.

Here, a TFT has a structure in which a gate electrode, an active layer, and source/drain electrodes are stacked on a substrate. Accordingly, when a current is supplied to the gate electrode through a circuit included in the substrate, a current flows to the source/drain electrode through the active layer. Furthermore, a current flows in a pixel electrode of a pixel unit that is electrically connected to the source/drain electrode.

The pixel unit additionally includes a facing electrode facing the pixel electrode, and a light-emitting layer interposed between the pixel electrode and the facing electrode. In an organic light-emitting display, the light-emitting layer is an organic light emissive layer, and in a liquid crystal display, the light-emitting layer is a liquid crystal layer that optionally transmits backlight.

As described above, when a current flows in the pixel electrode through the TFT, an appropriate voltage may be applied between the pixel electrode and the facing electrode, and accordingly, an image is displayed while light emanates from the light-emitting layer.

SUMMARY

One inventive aspect is a flat panel display in which the reduction of brightness characteristics is prevented by removing crystallization protrusions in an active layer of a thin-film transistor and a method of manufacturing the flat panel display apparatus.

Another aspect is a flat panel display comprising a thin-film transistor (TFT) and a pixel unit that is driven by the TFT, wherein the TFT includes: a substrate; a step difference layer having a relatively high step and a relatively low step on the substrate; and an active layer formed on a region corresponding to the relatively low step of the step difference layer.

The active layer may include a crystalline silicon material.

The step difference layer may include: a first insulating layer that forms a step on the substrate; a black matrix layer that forms an additional step on the first insulating layer; and a second insulating layer that is formed on the black matrix layer and is flush with the active layer.

The TFT may further include a gate electrode facing the active layer and source/drain electrodes connected to the active layer.

The pixel unit may include: a pixel electrode connected to the source/drain electrodes; a facing electrode facing the pixel electrode; and a light-emitting layer that is operated according to a voltage between the pixel electrode and the facing electrode, wherein the light-emitting layer is interposed between the pixel electrode and the facing electrode.

The light-emitting layer may include one of an organic light-emitting layer and a liquid crystal layer.

Another aspect is a method of manufacturing a flat panel display, the method including: forming a thin-film transistor (TFT); and forming a pixel unit that is driven by the TFT, wherein the forming of the TFT includes: forming a step difference layer having a relatively high step and a relatively low step on a substrate; forming an amorphous silicon layer on the step difference layer along a height shape of the step difference layer; crystallizing the amorphous silicon layer into a crystalline silicon layer; and polishing the crystalline silicon layer to form a planarized surface of the crystalline silicon layer having no height differences so that the crystalline silicon layer remains on a region corresponding to the low step and an active layer is formed.

The forming of the step difference layer may include: sequentially stacking a first insulating layer and a black matrix layer on the substrate; forming a step difference that is a relatively low step by selectively removing the first insulating layer and the black matrix layer through a photoresist process; and forming a second insulating layer on the black matrix layer along the shape of the step difference.

The crystallizing of the amorphous silicon layer may be performed using a sequential lateral solidification (SLS) method.

The polishing of the crystalline silicon layer may be performed using a chemical mechanical polishing (CMP) process.

The forming of the TFT may further include forming a gate electrode facing the active layer and forming source/drain electrodes connected to the active layer.

The forming of the pixel unit may include: forming a pixel electrode connected to the source/drain electrodes; forming a light-emitting layer on the pixel electrode; and forming a facing electrode facing the pixel electrode.

The light-emitting layer may include one of the organic light-emitting layer and a liquid crystal layer.

DETAILED DESCRIPTION

Figure 1:
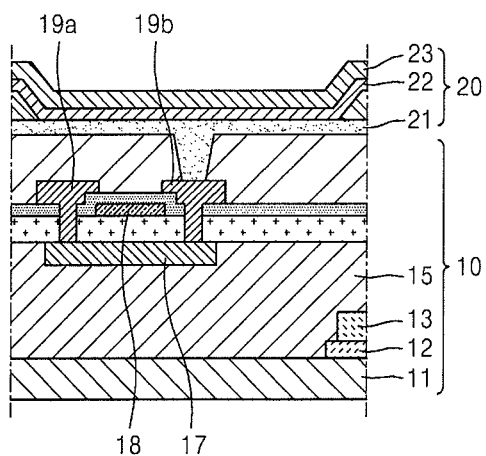
FIG. 1 is a cross-sectional view of an organic light-emitting display apparatus as an example of a flat panel display, according to an embodiment.

Recently, a sequential lateral solidification (SLS) method has frequently been used to form an active layer of a TFT using amorphous silicon. In that method, amorphous silicon is generally crystallized by irradiating a laser thereon. The entire amorphous silicon layer may melt except on both edges of the amorphous silicon layer which will act as seeds for crystallization.

However, when this crystallization process occurs, high crystallization protrusions are formed in the active layer, and frequently, they adversely affect the characteristics of the TFT. In this situation, the crystallization protrusions are upwardly formed in a central region of the amorphous silicon layer due to collision of grains grown from the both edges of the amorphous silicon layer. Thus, there is an unwanted brightness deviation between the region where the crystallization protrusions are formed and other regions.

Accordingly, there is a need to address the crystallization protrusion problem in order to secure the stable brightness across the entirety of a flat panel display.

Embodiments will now be described more fully with reference to the accompanying drawings.

In the drawings, like reference numerals in the drawings denote like elements. In describing embodiments, when practical descriptions with respect to a related known function and configuration may unnecessarily make the embodiments unclear, the descriptions thereof will be omitted.

In the drawings, the thicknesses of layers and regions are exaggerated for clarity.

It will be understood that when an element or layer is referred to as being "formed on," another element or layer, it can be directly or indirectly formed on the other element or layer.

FIG. 1 is a cross-sectional view of an organic light-emitting display as an example of a flat panel display, according to an embodiment.

The organic light-emitting display apparatus may include a thin-film transistor (TFT) 10 and a pixel unit 20.

The pixel unit 20 that is driven by the TFT 10 to realize an image includes a pixel electrode 21, a facing electrode 23 facing the pixel electrode 21, and an organic light-emitting layer 22 interposed between the pixel electrode 21 and the facing electrode 23 as a light-emitting layer.

A predetermined voltage is applied to the facing electrode 23, and a voltage is selectively applied to the pixel electrode 21 electrically connected to the TFT 10 by the TFT 10. Accordingly, when an appropriate voltage is applied between the pixel electrode 21 and the facing electrode 23 according to the selective application of the TFT 10, the organic light-emitting layer 22 between the pixel electrode 21 and the facing electrode 23 emits light, and thus, realizing an image.

The TFT 10 has a structure in which an active layer 17, a gate electrode 18, and source/drain electrodes 19a and 19b are sequentially stacked on a substrate 11. Therefore, if an electrical signal is applied to the gate electrode 18, a current flows from the source electrode 19a to the drain electrode 19b through the active layer 17. Accordingly, a voltage is applied to the pixel electrode 21 electrically connected to the drain electrode 19b, and thus, as described above, the organic light-emitting layer 22 emits light.

A first insulating layer 12, a black matrix layer 13, and a second insulating layer 15, which form a step difference, are sequentially formed between the substrate 11 and the active layer 17, and the active layer 17 is disposed on a region corresponding to a lower step of the step difference. That is, referring to FIG. 1, the first insulating layer 12 and the black matrix layer 13 are stacked to form an upper step and a lower step, respectively, and the active layer 17 is formed on a region corresponding to the lower step. As shown in FIG. 1, the second insulating layer 15 is planarized to substantially the same level as the active layer 17 through a manufacturing process. When the second insulating layer 15 is initially stacked, the second insulating layer 15 is formed along the shape of the step difference of the first insulating layer 12 and the black matrix layer 13, and the active layer 17 is stacked thereon. A detailed method of manufacturing the organic light-emitting display is described below.

In the current embodiment, as an example, a bottom emission type flat panel display in which an image is displayed towards the substrate 11 is shown, and the black matrix layer 13 covers a non-pixel region.

Figure 2:
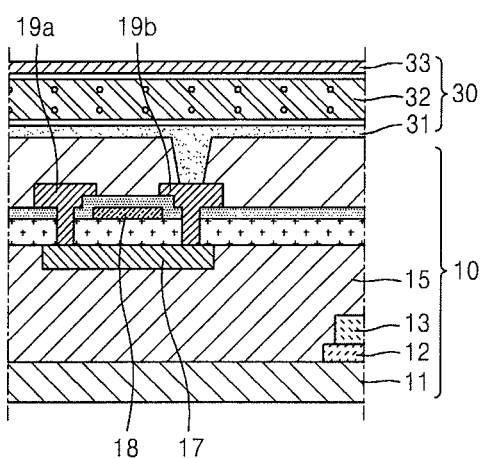
FIG. 2 is a cross-sectional view of a liquid crystal display as an example of a flat panel display, according to an embodiment.

FIG. 2 is a cross-sectional view of a liquid crystal display in which the TFT 10 is applied, as an example of a flat panel display, according to an embodiment.

In other words, the liquid crystal display includes a pixel unit 30 in which a liquid crystal layer 32 is formed between a pixel electrode 31 and a facing electrode 33 as a light-emitting layer and the TFT 10 of FIG. 1. This shows that the application of the TFT 10 of FIG. 1 is not limited to an organic light-emitting display, and the TFT can also be applied to a liquid crystal display as shown in FIG. 2.

Therefore, when an appropriate voltage is applied between the pixel electrode 31 and the facing electrode 33 due to the selective application of a voltage of the TFT 10, the liquid crystal layer 32 selectively transmits light generated from a backlight unit (not shown) by varying the arrangement of liquid crystals in the liquid crystal layer 32, and thus, realizing an image.

Hereinafter, a method of manufacturing the TFT 10 that may be applied to a flat panel display such as the organic light-emitting display of FIG. 1 and the liquid crystal display of FIG. 2 will be described.

FIGS. 3A through 3I are cross-sectional views sequentially showing a method of manufacturing the TFT 10.

Figure 3A:
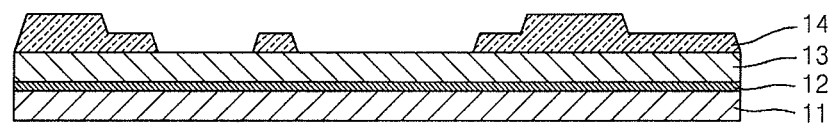
FIGS. 3A through 3I are cross-sectional views sequentially showing a method of manufacturing a thin-film transistor of a flat panel display, according to an embodiment.

Referring to FIG. 3A, the first insulating layer 12 and the black matrix layer 13 are formed on the substrate 11, and a photoresist layer 14 is formed on the black matrix layer 13. FIG. 3A shows a resultant structure on which a mask exposure operation with respect to the photoresist layer 14 has already been performed. Regions where the photoresist layer 14 remains the thickest are non-exposure regions, regions where the black matrix layer 13 is completely removed are completely exposed regions, and regions where the photoresist layer 14 remains a medium-height are halftone exposure regions.

Figure 3B:
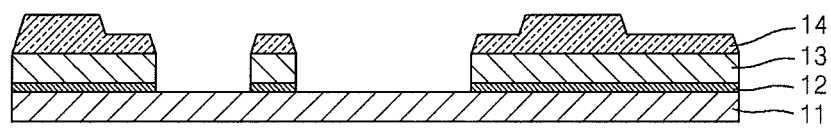

Referring to FIG. 3B, in the above state, the black matrix layer 13 and the first insulating layer 12 are sequentially removed in the regions where the photoresist layer 14 is removed by performing etching processes.

Figure 3C:
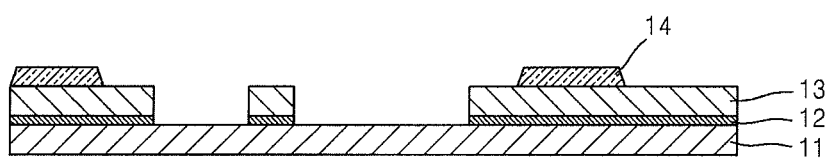
Figure 3D:
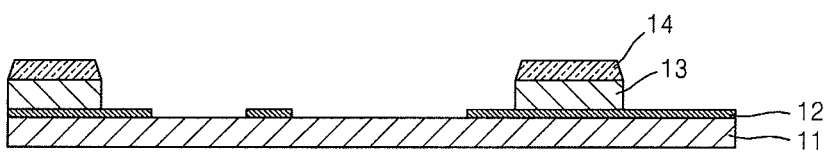

Then, as shown in FIG. 3C, after removing the photoresist layer 14 except for the non-exposure regions, as depicted in FIG. 3D, the black matrix layer 13 is further etched using the remaining photoresist layer 14.

Figure 3E:

Referring to FIG. 3E, when all the remaining photoresist layer 14 is removed, a structure in which the first insulating layer 12 forms a first step on the substrate and the black matrix layer 13 additionally forms a second step on the first step is formed.

Figure 3F:
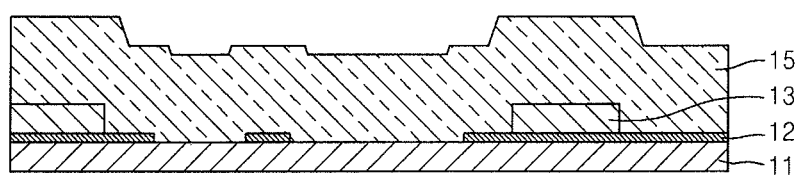

When the second insulating layer 15 is formed on the resultant structure, as depicted in FIG. 3F, a step difference layer that includes the first insulating layer 12, the black matrix layer 13, and the second insulating layer 15 is formed. In other words, a high step and a low step are formed on the substrate 11 by the first insulating layer 12, the black matrix layer 13, and the second insulating layer 15. The first and second insulating layers 12 and 15 may be formed of a material selected from the group consisting of $SiO_2$, $SiNx$, $SixNy$, and SiON.

Figure 3G:
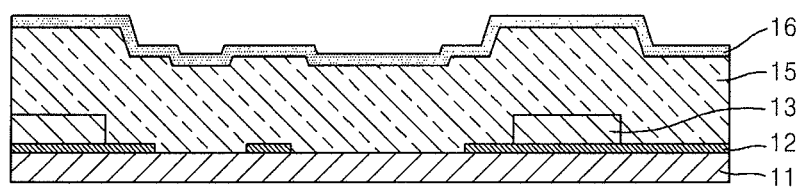

In one embodiment, as shown in FIG. 3G, an amorphous silicon layer 16 is formed on the second insulating layer 15, and the amorphous silicon layer 16 is crystallized by using, for example, a sequential lateral solidification (SLS) method.

Figure 3H:
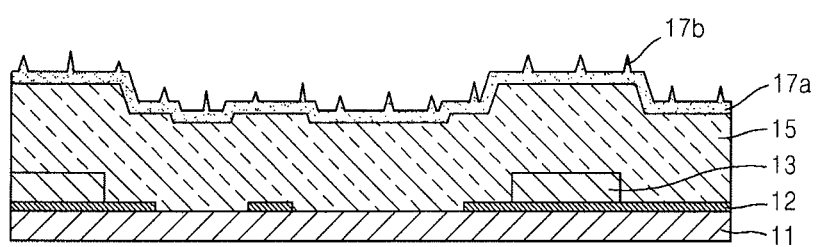

Then, as shown in FIG. 3H, the amorphous silicon layer 16 is changed into a crystalline silicon layer 17a. At this point, as described above, a lot of crystallization protrusions 17b are formed due to the characteristic of the SLS method. Because the crystallization protrusions 17b are a cause of increasing brightness deviation of a flat panel display, in the current embodiment, the crystallization protrusions 17b are removed by a chemical-mechanical polishing (CMP) process.

Figure 4:
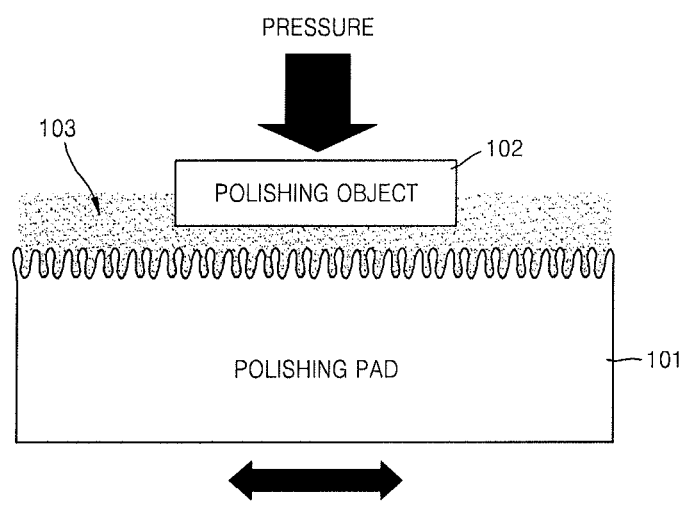
FIG. 4 is a schematic drawing for explaining a chemical mechanical polishing (CMP) process.

The CMP process is performed as the principle shown in FIG. 4. In other words, in a state that a polishing object 102 tightly contacts a polishing pad 101 by applying a pressure, the polishing object 102 is polished due to a relative motion between the polishing object 102 and the polishing pad 101 by supplying a processing liquid such as slurry 103. In this way, a chemical polishing action by the slurry 103 and a mechanical polishing action by the polishing pad 101 are combined together, and thus, the polishing object 102 is smoothly polished.

In the current embodiment, a stack from the substrate 11 to the crystalline silicon layer 17a corresponds to the polishing object 102, and the polishing is performed in a state that the crystalline silicon layer 17a on which the crystallization protrusions 17b are formed tightly contacts with the polishing pad 101.

Figure 3I:
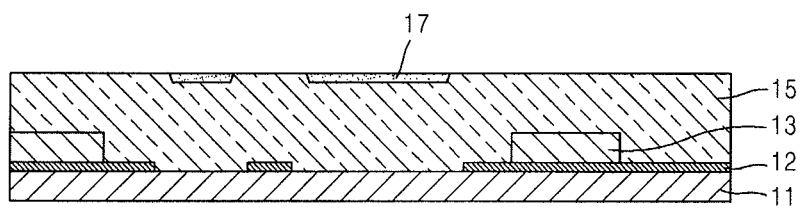

In one embodiment, when the CMP process is complete, as shown in FIG. 3I, the crystalline silicon layer 17a formed on regions corresponding to the lowest step of the step difference remains to form the active layer 17, and the second insulating layer 15 is flushed with the active layer 17.

In this way, because the active layer 17 is formed through a polishing process without using an additional photoresist process, not only the manufacturing is easy, but also the crystallization protrusions 17b that increase brightness deviation are completely removed.

Afterwards, when the gate electrode 18 and the source/drain electrodes 19a and 19b are formed, the manufacturing of the TFT 10 is complete. Also, when the pixel unit 20 that includes the pixel electrode 21, the organic light-emitting layer 22, and the facing electrode 23 is formed on the TFT 10, the manufacturing of the organic light-emitting display of FIG. 1 is complete. Also, when the pixel unit 30 in which the pixel electrode 31, the liquid crystal layer 32, and the facing electrode 33 are formed is formed, the manufacturing of the liquid crystal display of FIG. 2 is complete.

Accordingly, the active layer 17 of the TFT 10 can be formed in a stable structure without any crystallization protrusions, and a flat panel display including the TFT 10 guarantees a product with a stable quality.

In the drawings for explaining embodiments, only one TFT and one pixel unit are depicted for convenience of explanation. However, this is not considered limiting, and a plurality of TFTs and a plurality of pixel units may also be included in a flat panel display.

According to at least one of the disclosed embodiments, crystallization protrusions can be effectively removed from the active layer, and thus, a flat panel display will have substantially evenly distributed brightness, thereby reducing the rate of product failure.

While the disclosed embodiments have been particularly shown and described with reference to the accompanying drawings, it will be understood by those of ordinary skill in the art that various changes in form and details may be made therein without departing from the spirit and scope of the following claims.

What is claimed is:

1. A method of manufacturing a flat panel display, the method comprising:
    forming a pixel unit on a substrate; and
    forming a thin-film transistor (TFT) configured to drive the pixel unit,
    wherein the forming of the TFT comprises:
        forming a step difference layer having a relatively high step and a relatively low step on the substrate such that a top surface of the step difference layer has different heights measured from the substrate;
        forming an amorphous silicon layer on the step difference layer along the top surface of the step difference layer;
        crystallizing the amorphous silicon layer into a crystalline silicon layer; and
        polishing the crystalline silicon layer to form a planarized surface of the crystalline silicon layer having no height differences so that the crystalline silicon layer, which remains on a region corresponding to the low step, becomes an active layer,
    wherein the forming of the step difference layer comprises:
        sequentially stacking a first insulating layer and a black matrix layer on the substrate;
        removing at least a portion of the first insulating layer and at least a portion of the black matrix layer so as to form a step difference; and
        forming a second insulating layer on the black matrix layer along the shape of the step difference.

2. A method of manufacturing a flat panel display, the method comprising:
    forming a pixel unit on a substrate; and
    forming a thin-film transistor (TFT) configured to drive the pixel unit,
    wherein the forming of the TFT comprises:
        forming a step difference layer having a relatively high step and a relatively low step on the substrate such that a top surface of the step difference layer has at least three different heights measured from the substrate, wherein the top surface is substantially parallel to the substrate;
        forming an amorphous silicon layer on the step difference layer along the top surface of the step difference layer;
        crystallizing the amorphous silicon layer into a crystalline silicon layer; and
        polishing the crystalline silicon layer to form a planarized surface of the crystalline silicon layer having no height differences so that the crystalline silicon layer, which remains on a region corresponding to the low step, becomes an active layer.

3. The method of claim 2, wherein the crystallizing of the amorphous silicon layer is performed by a sequential lateral solidification (SLS) method.

4. The method of claim 2, wherein the polishing of the crystalline silicon layer is performed by a chemical mechanical polishing (CMP) process.

5. The method of claim 2, wherein the forming of the TFT further comprises:
    forming a gate electrode located substantially directly above the active layer; and
    forming source/drain electrodes electrically connected to the active layer.

6. The method of claim 5, wherein the forming of the pixel unit comprises:
    forming a pixel electrode electrically connected to the source/drain electrodes;
    forming a light-emitting layer on the pixel electrode; and
    forming a facing electrode on the light-emitting layer to face the pixel electrode.

7. The method of claim 6, wherein the light-emitting layer comprises one of an organic light-emitting layer and a liquid crystal layer.

8. The method of claim 2, wherein the top surface of the step difference layer is continuous.

\* \* \* \* \*